(12) United States Patent
Hsueh et al.

(10) Patent No.: US 7,843,747 B2
(45) Date of Patent: Nov. 30, 2010

(54) SYSTEM AND METHOD FOR BETTER TESTABILITY OF OTP MEMORY

(75) Inventors: Fu-Lung Hsueh, Cranbury, NJ (US);
Shine Chung, Taipei Hsien (TW);
Wen-Kuan Fang, Taipei (TW);
Po-Hung Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 252 days.

(21) Appl. No.: 12/124,989

(22) Filed: May 21, 2008

(65) Prior Publication Data

US 2009/0141573 A1    Jun. 4, 2009

Related U.S. Application Data

(60) Provisional application No. 60/991,684, filed on Nov. 30, 2007.

(51) Int. Cl.
*G11C 29/00* (2006.01)
(52) U.S. Cl. .................. 365/201; 365/200; 365/185.09

(58) Field of Classification Search .................. 365/201, 365/185.09, 200
See application file for complete search history.

(56) References Cited

U.S. PATENT DOCUMENTS 6,031,772 A * 2/2000 Nagatomo ............... 365/201
6,515,923 B1 * 2/2003 Cleeves .................. 365/201

* cited by examiner

*Primary Examiner*—Tuan T Nguyen
*Assistant Examiner*—Toan Le
(74) *Attorney, Agent, or Firm*—K&L Gates LLP

(57) ABSTRACT

A system for testing logic circuits for executing writing and reading operations in a one-time programmable (OTP) memory having an array of memory cells is disclosed, the system comprising a column of testing cells having the same number of cells as that of an entire column of the array of memory cells, a row of testing cells having the same number of cells as that of an entire row of the array of memory cells, wherein both the column and row of testing cells are first written to and then read out from during a testing operation, and can never be accessed during non-testing operations of the OTP memory.

12 Claims, 2 Drawing Sheets

SYSTEM AND METHOD FOR BETTER TESTABILITY OF OTP MEMORY

PRIORITY DATA

The present invention claims priority to provisional patent application No. 60/991,684 filed Nov. 30, 2007.

BACKGROUND

The present invention relates generally to integrated circuit (IC) designs, and more particularly to testing of one-time-programmable (OTP) memories.

After a memory IC is manufactured, all of its memory cells as well as the associated logic circuits must be tested before being shipped to a customer. Because the memory cells occupy relatively larger chip area than the logic circuits, and therefore have bigger chance of having defects, conventional memory testing has been focused on testing the memory cells through repeatedly writing to and reading from the memories cells. Testing the memory cells will inevitably test the associated logic circuits as the logic circuits perform the address decoding, reading and writing functions. Random access memories, such as dynamic random access memory (DRAM) and static random access memory (SRAM), as well as non-volatile Flash memory can be tested by the above conventional testing method, because cells in these memories can be repeatedly written to and read from.

However, the conventional testing method cannot quickly test only the logic circuits, as accessing all the cells in a modern high-density memory takes long time. More over, some memories, such as OTP memory, do not allow for repeated write operation. Therefore, logic circuit in such memories cannot be tested through testing the memory cells. In case of the OTP memory, the memory cells can only be written once, and such right is reserved for an end user.

As such, what is desired is a system and method for quickly testing the logic circuits in a memory IC without affecting the usability thereof.

SUMMARY

In view of the foregoing, the present invention provides a system for testing logic circuits for executing writing and reading operations in a one-time programmable (OTP) memory having an array of memory cells. According to one aspect of the present invention, the system comprises a column of testing cells having the same number of cells as that of an entire column of the array of memory cells, a row of testing cells having the same number of cells as that of an entire row of the array of memory cells, wherein both the column and row of testing cells are first written to and then read out from during a testing operation, and can never be accessed during non-testing operations of the OTP memory.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a system and method for directly testing logic circuits in a memory integrated circuit (IC).

Figure 1:
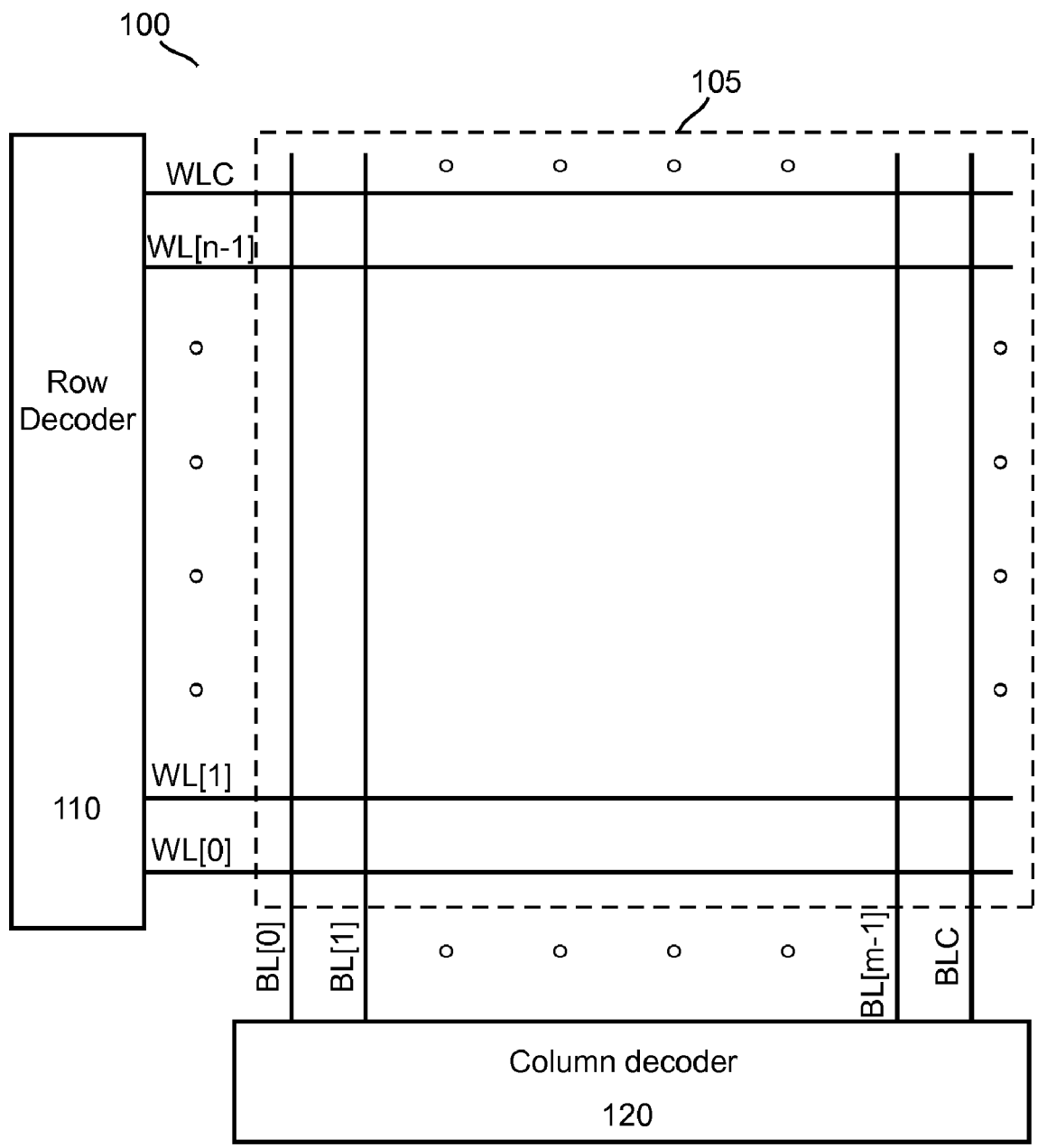
FIG. 1 is a schematic diagram illustrating a one-time-programmable (OTP) memory block according to one embodiment of the present invention.

FIG. 1 is a schematic diagram illustrating a one-time-programmable (OTP) memory block 100 according to one embodiment of the present invention. The OTP memory block 100 has a cell block 105 which consists of an array of OTP storage cells arranged in (n) number of rows and (m) number of columns, where both n and m are integers. There is a word-line, WLC or WL[i], where i=0, 1, 2 ..., n−1, coupled to each row of cells. Each column of cells is coupled to a bit-line, BLC or BL[j], where j=0, 1, 2 ..., m−1. The cells on the word-lines, WL[0:n−1], and the bit-lines, BL[0:m−1], are regular storage cells. The cells on the testing word-line, WLC, and the testing bit-line, BLC, are testing cells, which are structurally identical to the regular storage cells, but used solely for the testing purpose. The testing cells are used because the regular cells of the OTP memory 100 cannot be repeatedly programmed, but testing the logic circuits requires at least one writing step, therefore, the testing cells are used for performing the writing step. The testing cells are essentially destroyed after the testing. We used n×m cell array with one extra row and column as example here, but the number of rows and columns could be more than one and should not affect the scope of this invention.

Referring again to FIG. 1, the word-lines, WLC and WL[0:n−1], are controlled by a row decoder 110. The bit-lines, BLC and BL[0:m−1], are controlled by a column decoder 120. The logic circuits, though not shown in FIG. 1, include the entire peripheral circuits that enable the OTP memory 100 to properly function during read and write operations.

Figure 2:
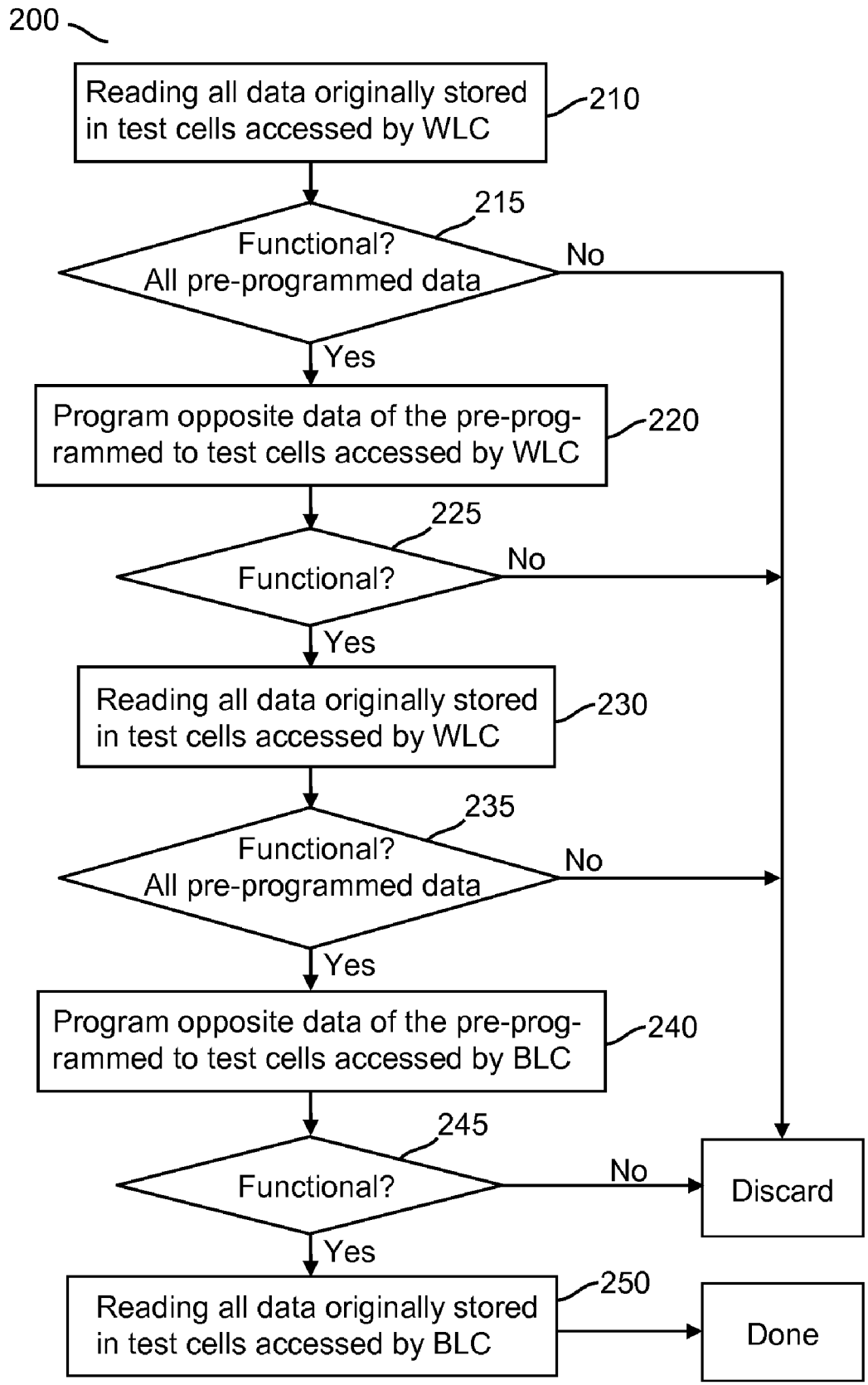
FIG. 2 is a flow-chart diagram illustrating an exemplary testing procedure according to the embodiment of the present invention.

FIG. 2 is a flow-chart diagram illustrating an exemplary testing procedure 200 according to the embodiment of the present invention. The testing procedure 200 is performed on the OTP memory 100 of FIG. 1, and starts with a first reading step 210 in which the original data stored in the testing cells coupled either to the testing word-line, WLC, or the testing bit-line, BLC are first read out. Typically the original data in the OTP memory is represented by all "0s" which correspond to lower threshold values. If a "1" is read out from a particular testing cell, that particular testing cell or its corresponding addressing circuit and/or sensing circuit may be defective. However, 0 and 1 are arbitrary and should not affect the scope of this invention. The aforementioned functional test for initial reading is represented by a step 215 in FIG. 2.

Since the testing cells occupies only one row and one column area of the exemplary cell block 105 in FIG. 1, their chance of getting defects are relatively small comparing to the entire logic circuit. Therefore, when the first reading step 210 indicates a defect, the logic circuits are deemed defective and the entire chip is abandoned saving further backend processes such as packaging and more testing. Typically there is no field repair circuitry designed for a logic circuit defect.

After the initial reading test, opposite data are programmed into the testing cells which are subsequently read out in following steps, therefore writing circuits as well as addressing and sensing circuits are tested. In step 220, data opposite to the original data, i.e., "1s" for the OTP memory, are written to the testing cells accessed by the WLC without writing to any regular cells. Not writing to the regular cells is to preserve their one-time program capability for an end user. The programming step 220 is following by a functional testing step 225. If any of the accessed testing cells fails to be programmed, the OTP memory 100 will be discarded right away.

Following the writing functional testing step 225, a second reading step 230 is executed on the WLC accessed testing cells that have just been programmed. The functional test of the reading step 230 is represented by step 235. If the first reading step 210 tells all "0s" from the testing cells, and the second reading step 230 tells all "1s" from the same testing cells, then the logic circuits relates to the WLC accessed cells can be concluded as functionally correct. Otherwise, some defects must be present in either the testing cells themselves or in the logic circuits such as addressing and sensing, and the OTP memory 100 has to be discarded.

Similarly, in a surviving OTP memory 100, testing cells accessed by the BLC is programmed with an opposite data in step 240 without writing to any regular cells. There is also a functional test step 245 for the programming step 240. If any of the accessed testing cells fails to be programmed, the OTP memory 100 will be discarded right away.

Following the writing functional testing step 245, a third reading step 250 is executed on the BLC accessed testing cells that have just been programmed. The functional test of the reading step 250 is represented by step 255. If the first reading step 210 tells all "0s" from the testing cells, and the third reading step 230 tells all "1s" from the same testing cells, then the logic circuits relates to the BLC accessed testing cells can be concluded as functionally correct. Otherwise, some defects must be present in either the testing cells themselves or in the logic circuits such as addressing and sensing, and the OTP memory 100 has to be discarded. When surviving both the WLC related tests in steps 220~235 and the BLC related tests in steps 240~255, the OTP memory 100 can then be considered a good part.

Although the testing cells may be randomly read, it is faster to sequentially read all the testing cells in one direction before proceeding to the other direction. For testing logic circuits in the column direction, the testing word-line, WLC, is selected, while the bit-lines BL[0:m−1] are sequentially selected. In this way, every testing cell coupled to the WLC is sequentially read. The column pass gate logic coupled with some control logic could be tested. Similarly, for testing logic circuits in the row direction, the testing bit-line, BLC, is selected, while the word-lines WL[0:n−1] are sequentially selected. In this way, every testing cell coupled to the BLC is sequentially read. The row decode logic coupled with some control logic could be tested. If the test row and column are pre-programmed to check-board patterns of alternate 0 and 1, reading test row and column can test the read sense amplifier, row/column decoders and pass gates, and control logic. This can provide very good fault coverage. Without this invention, the tests for OTP can only read a blank chip with all 0s. The row and column decoding circuits and control logic are not testable. The reading steps 210, 230 and 250, in fact, are not limited to reading just the testing cells coupled to either WLC or BLC, other regular cells may also be read as the reading steps 210, 230 and 250 is non-destructive to the memory cells. But for testing only the logic circuits, the reading steps 210, 230 and 250 should be performed only on the testing cells to speed up the testing procedure 200.

Referring back to FIG. 1, although the testing WLC and BLC are placed at the edge of the cell block 105 in FIG. 1, a skilled artisan would realize that the testing WLC and BLC may be arrange anywhere in the cell block 105.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A circuit for testing logic circuits for executing writing and reading operations in a one-time programmable (OTP) memory having an array of memory cells, the circuit comprising:
   a column of testing cells having substantially the same number of cells as that of an entire column of the array of memory cells; and
   a row of testing cells having substantially the same number of cells as that of an entire row of the array of memory cells, wherein the testing cells and the memory cells have an identical structure;
   wherein at least one cell in the column and row of testing cells is first written to and then read out from during a testing operation, and can never be accessed during non-testing operations of the OTP memory.

2. The circuit of claim 1, wherein the column or row of testing cells are consecutively written in an alternate "1" and "0" pattern, and then consecutively read out.

3. The circuit of claim 1, wherein the column or row of the testing cells is read out prior to being written to.

4. The circuit of claim 3, wherein a value written to a testing cell is opposite to a value being read out from the same testing cell.

5. A test system embedded in an integrated circuit (IC) comprising:
   a first plurality of one-time programmable (OTP) memory cells arranged in a column;
   a second plurality of OTP memory cells arranged in a row perpendicular to the column, wherein the first and second plurality of OTP memory cells are part of an OTP memory array and all the cells therein have an identical structure; and
   a logic circuit configured to program to and read out from the first and second plurality of OTP memory cells only during a test operation,
   wherein both the first and second pluralities of OTP memory cells are accessible electronically only during the test operation.

6. The test system of claim 5, wherein the first or second plurality of OTP memory cells are consecutively written in an alternate "1" and "0" pattern, and then consecutively read out.

7. The test system of claim 5, wherein the first or second plurality of OTP memory cells are read out prior to being written to.

8. The circuit test system of claim 7, wherein a value written to an OTP memory cell is opposite to a value being read out from the same testing cell.

9. A method for testing logic circuits of a one-time programmable (OTP) memory having an array of memory cells, the method comprising:
- providing a column of testing cells having substantially the same number of cells as that of an entire column of the array of memory cells;
- providing a row of testing cells having substantially the same number of cells as that of an entire row of the array of memory cells, wherein the testing cells and the memory cells have an identical structure;
- accessing at least one of the testing cells during a test operation; and forbidding accessing the testing cells during operations other than the test operation.

10. The method of claim 9, wherein the accessing comprises consecutively writing in the testing cells an alternate "1" and "0" pattern, and then consecutively reading out from the testing cells.

11. The method of claim 9, wherein the accessing comprises reading from the testing cells prior to writing to the same.

12. The method of claim 11, wherein a value written to a testing cell is opposite to a value being read out from the same testing cell.

* * * * *